United States Patent [19]

Fiedziuszko

[11] Patent Number: 4,780,691
[45] Date of Patent: Oct. 25, 1988

[54] DIELECTRIC RESONATOR FREQUENCY DISCRIMINATOR FOR STABILIZING OSCILLATOR FREQUENCY

[75] Inventor: Slawomir J. Fiedziuszko, Palo Alto, Calif.

[73] Assignee: Ford Aerospace & Communications Corporation, Detroit, Mich.

[21] Appl. No.: 81,259

[22] Filed: Aug. 3, 1987

[51] Int. Cl.⁴ ............................................. H03L 7/04
[52] U.S. Cl. ...................................... 331/9; 307/519; 328/140; 333/235
[58] Field of Search ................... 331/1 R, 9; 307/519; 328/140, 141; 329/116; 333/209, 212, 219, 235

[56] References Cited

U.S. PATENT DOCUMENTS

| | | | |
|---|---|---|---|
| 2,502,456 | 4/1950 | Hansen et al. | 455/263 |
| 3,796,970 | 3/1974 | Snell, Jr. | 333/134 |
| 4,079,341 | 3/1978 | Linn et al. | 331/96 |
| 4,149,127 | 4/1979 | Murakami et al. | 331/96 |
| 4,307,352 | 12/1981 | Shinkawa et al. | 331/99 |
| 4,489,293 | 12/1984 | Fiedziuszko | 333/212 X |
| 4,540,955 | 9/1985 | Fiedziuszko | 331/107 DP |
| 4,675,630 | 6/1987 | Tang et al. | 333/212 X |
| 4,694,260 | 9/1987 | Argintaru et al. | 329/116 X |

FOREIGN PATENT DOCUMENTS 1238196  6/1986  U.S.S.R. ............................. 329/116

OTHER PUBLICATIONS

Kvarna, "Cavity Stabilization", Microwave Journal, vol. 21, No. 9, Sep. 1978, p. 46.
Glance et al., "A Discriminator-Stabilized Microstrip Oscillator", *IEEE Transactions on Microwave Theory and Techniques*, Oct. 1976, pp. 648-650.
Bianchini et al., "A Single-Resonator GaAs FET Oscillator with Noise Degeneration", 1984 *IEEE MTT-S Digest*, pp. 270-273.
Majewski, "Microwave FM Signal Discriminator Circuit Using Dielectric Resonators", *Proceedings of the 16th European Microwave Conference*, Dublin, Ireland, 8-12, Sep. 1986, pp. 447-452.
Otobe et al., "A Low-Drift Oscillator Stabilized by a Highly Sensitive Discriminator", *Proceedings of the 13th European Microwave Conference*, Nuremberg, Germany, 5-8, Sep. 1983, pp. 319-324.

*Primary Examiner*—Siegfried H. Grimm
*Attorney, Agent, or Firm*—Edward J. Radlo; Keith L. Zerschling

[57] ABSTRACT

A frequency discriminator (1) stabilizes a voltage controlled oscillator (5), particularly one operating at microwave frequencies. A single dielectric resonator (2), typically positioned within a housing (8), is excited by an r.f. input (30). The dielectric resonator (2) generates in response to the excitation first and second orthogonal modes of r.f. electromagnetic energy at slightly different frequencies. The two orthogonal modes are converted to d.c. output signals (39, 40) of opposite polarity and substantially the same magnitude, e.g., by diodes (35, 36). Frequency offsets are obtained by tuning screws (43, 44) and/or by changing the amount of dielectric (2) in the path of the characterizing vector corresponding to the mode being frequency-offset.

8 Claims, 2 Drawing Sheets

E FIELD OF R.F. INPUT →

MODE 1
MODE 2

FIG. 4 DETECTED OUTPUT SIGNAL OF THE DISCRIMINATOR
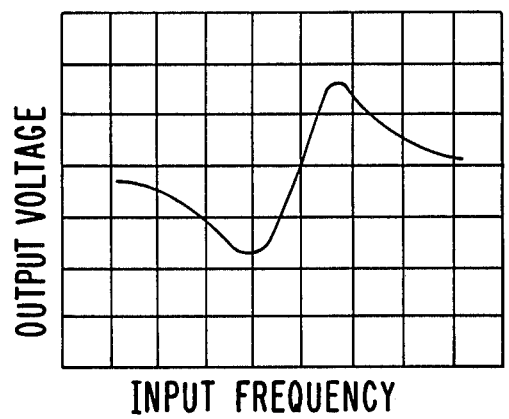
FIG. 5 INPUT RETURN LOSS OF THE DISCRIMINATOR
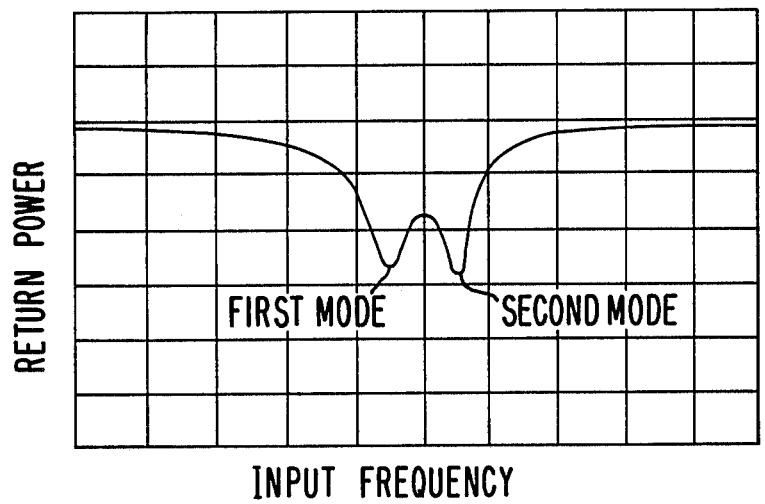
FIG. 6
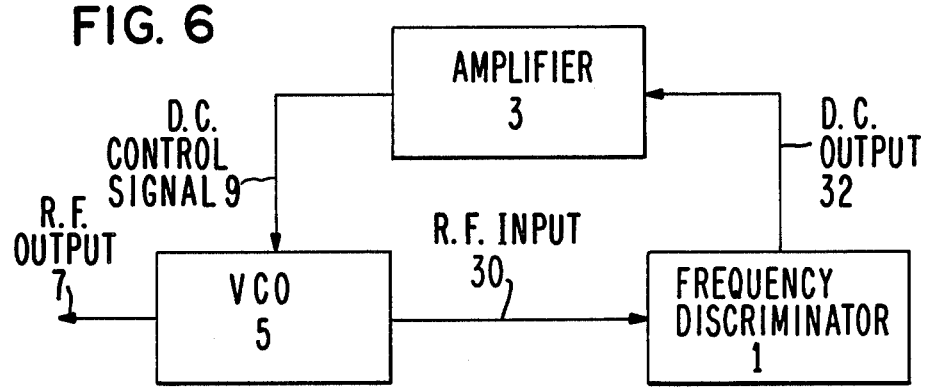

DIELECTRIC RESONATOR FREQUENCY DISCRIMINATOR FOR STABILIZING OSCILLATOR FREQUENCY

DESCRIPTION

1. Technical Field

This invention pertains to the field of stabilizing electromagnetic oscillators, particularly at microwave frequencies.

2. Background Art

Several techniques can be used for stabilizing oscillators such as solid state fundamental frequency oscillators used at microwave frequencies. These techniques include: (1) phase locking to a stable reference signal; (2) using a high Q cavity for the oscillator itself, with or without a dielectric resonator; (3) injection locking; and (4) using a frequency discriminator circuit.

U.S. Pat. No. 2,502,456 illustrates a classic cavity type frequency discriminator. Two modes are used, as in the present invention; but no dielectric resonator is shown. Kvarna, "Cavity Stabilization", *Microwave Journal*, Vol. 21, No. 9, Sept. 1978, p. 46, shows an application of this type of frequency discriminator.

Glance et al., "A Discriminator-Stabilized Microstrip Oscillator", *IEEE Transactions on Microwave Theory and Techniques*, Oct. 1976, pp. 648–650, shows a dual mode frequency discriminator using a microstrip resonator. This circuit (which does not show a dielectric resonator) is not able to achieve the same Q or the same degree of temperature stability as the present invention. Techniques of this reference are further described in U.S. Pat. No. 3,796,970.

Bianchini et al., "A Single-Resonator GaAs FET Oscillator with Noise Degeneration", 1984 *IEEE MTT-S Digest*, pp. 270–273, shows a single mode dielectric resonator frequency discriminator. It is more complex and heavier than the present invention.

U.S. Pat. No. 4,540,955 shows a dual mode cavity stabilized oscillator in which the oscillator output is taken from the cavity itself. The output of a cavity type frequency discriminator is not the oscillator output. In the reference patent, no diodes are present. Furthermore, in the reference the oscillator cavity is used in an r.f. feedback configuration with an amplifier. In a frequency discriminator, on the other hand, the oscillator's control signal is d.c. rather than r.f.

U.S. Pat. Nos. 4,079,341; 4,149,127; and 4,307,352 give examples of dielectric resonators used to stabilize microwave oscillators by means of r.f. coupling. There is no conversion to direct current as with the frequency discriminator of the present invention.

Majewski, "Microwave FM Signal Discriminator Circuit Using Dielectric Resonators", *Proceedings of the 16th European Microwave Conference*, Dublin, Ireland, Sept. 8–12, 1986, pp. 447–452, shows two single mode dielectric resonators used as a frequency discriminator. The present invention uses a single dielectric resonator in a simpler, lighter configuration.

Otobe et al., "A Low-Drift Oscillator Stabilized by a Highly Sensitive Discriminator", *Proceedings of the 13th European Microwave Conference*, Nuremberg, Germany, Sept. 5–8, 1983, pp. 319–324, shows a phase/frequency discriminator using a single mode dielectric resonator and dual gate FET's.

DISCLOSURE OF INVENTION

The present invention is a frequency discriminator (1) which serves to stabilize an electromagnetic oscillator (5). The frequency discriminator (1) comprises a single dielectric resonator (2) excited by an r.f. input (30). In response to this excitation, the dielectric resonator (2) generates two orthogonal modes of electromagnetic energy at slightly different frequencies. The two modes are converted to two d.c. outut signals (39, 40) having opposite polarity and substantially the same magnitude. The two output signals (39, 40) are combined to form a control signal (32) which is fed to the oscillator (5).

BRIEF DESCRIPTION OF THE DRAWINGS

These and other more detailed and specific objects and features of the present invention are more fully disclosed in the following specification, reference being had to the accompanying drawings, in which:

FIG. 4 is a graph of the output response of the frequency discriminator 1 of FIGS. 1–3;

FIG. 5 is a graph of the measured return loss of the frequency discriminator 1 of FIGS. 1–3; and FIG. 6 is a simplified block diagram illustrating the utilization of frequency discriminator 1 of the present invention in stabilizing an oscillator 5.

BEST MODE FOR CARRYING OUT THE INVENTION

Figure 1:
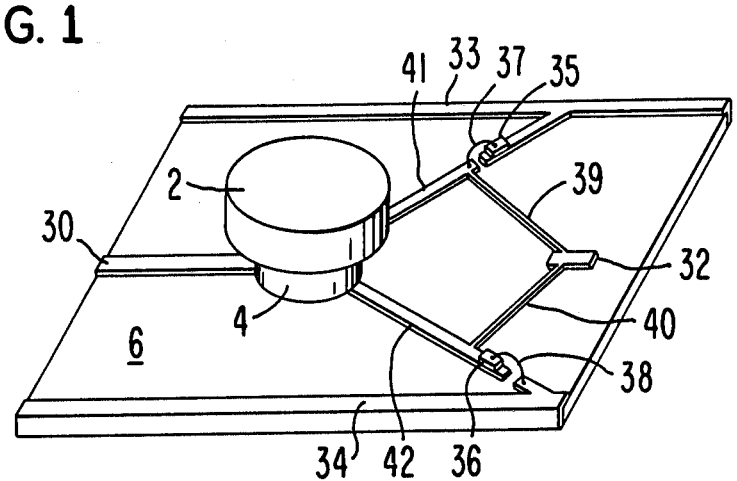
FIG. 1 is an isometric view of a typical frequency discriminator 1 of the present invention, minus housing 8.

FIG. 6 shows how frequency discriminator 1 of the present invention is used in a circuit to stabilize the r.f. output 7 emanating from electromagnetic oscillator 5. Oscillator 5 can be any kind of voltage controlled oscillator, e.g., of the cavity, microstrip, or stripline variety. Oscillator 5 may or may not employ a dielectric resonator therewithin. The control input 9 to oscillator 5 is a direct current. This direct current is the output 32 of discriminator 1 after amplification by an operational amplifier 3. The r.f. input 30 driving discriminator 1 is typically derived from oscillator 5 itself.

R.f. input 30 excites two orthogonal modes of r.f. electromagnetic energy in dielectric resonator 2, which typically has a circular or square cross-section. In the illustrated embodiment, resonator 2 has a circular cross-section. The two excited modes are tuned to slightly different frequencies, e.g., by tuning screws 43, 44. The two orthogonal modes are weakly coupled through conductors 41, 42 where they are converted to direct current by means of opposite polarity diodes 35, 36, respectively. The output voltage from the diodes 35, 36 is proportional to the r.f. frequency on conductor 41, 42, respectively. These d.c. voltages are combined at output conductor 32 into the classic frequency discriminator S-curve illustrated in FIG. 4. FIG. 4 is a graph of output voltage at conductor 32 as a function of the frequency of r.f. inputs 41. 42. Vertical divisions are 10 millivolts and horizontal divisions are 1 MHz. The curve is flat except for a single negative and a single positive voltage peak of substantially equal magnitude.

The voltage peaks correspond to the two orthogonal modes.

Figure 2:
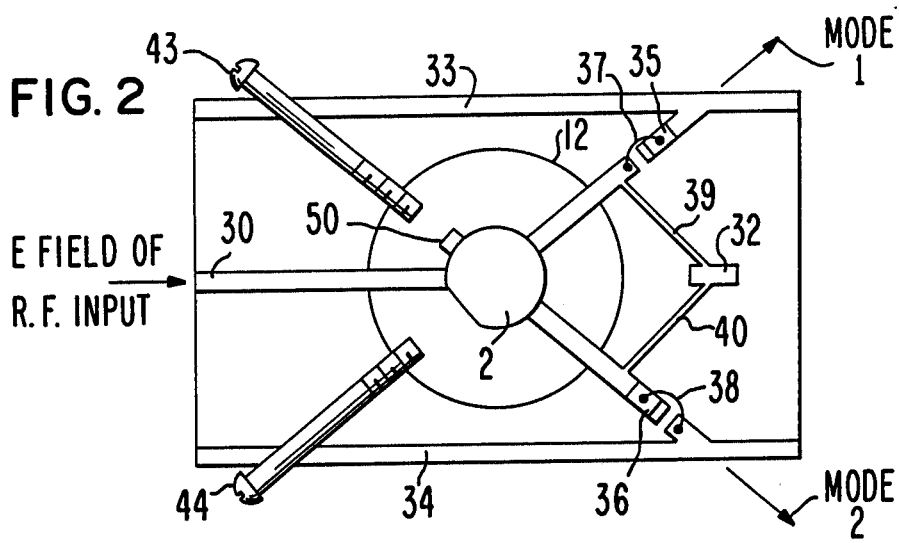
FIG. 2 is a top planar view of the frequency discriminator 1 illustrated in FIG. 1.
Figure 3:
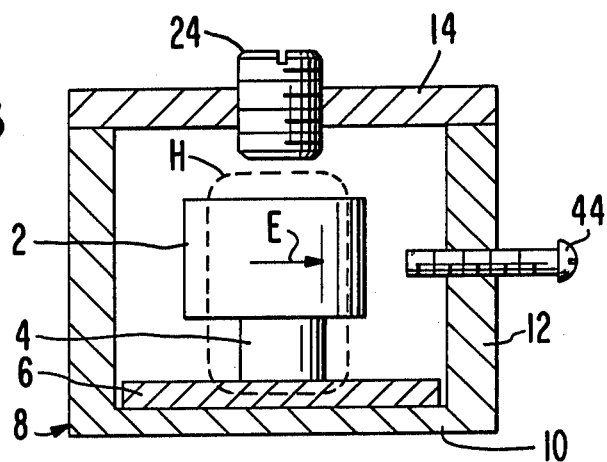
FIG. 3 is a side view, partly in cross-section, of the frequency discriminator 1 of FIGS. 1 and 2, with housing 8 present.

Modes which can be excited by resonator 2 are degenerative modes such as $HE_{11\delta}$ and $EH_{11\delta}$. In the embodiment illustrated herein, $HE_{11\delta}$ is used. FIG. 3 shows that for these modes, the H (magnetic) field has a generally ellipsoidal shape. The E (electrical) field is piecewise linear, orthogonal to the H field, and oriented radially with respect to dielectric resonator 2. The vectors labeled "mode 1" and "mode 2" in FIG. 2 illustrate the E field for these modes. Thus, these vectors are characterizing vectors for the two orthogonal modes.

The components of discriminator 1 are normally but not necessarily enclosed in a metallic housing 8 to trap the electromagnetic field, and thereby prevent radiation loss. To avoid cluttering the drawings, housing 8 is not illustrated in FIGS. 1 and 2. when housing 8 is present, discriminator 1 can be said to be of the cavity type.

Dielectric resonator 2 should be fabricated of a high Q material, with high temperature stability and high dielectric constant. Suitable materials are Resomics (TM) R-03C and R-04C, manufactured by Murata Manufacturing Company. R-03C has an unloaded Q of 15,000 and a dielectric constant of 30. It consists of $Ba(NiTa)O_3-Ba(ZrZnTa)O_3$ with added perovskite. R-04C has an unloaded Q of 8000 and a dielectric constant of 37. It consists of $(ZrSn)TiO_4$.

Resonator 2 is supported on a low loss (low dielectric constant) support 4 to maximize the Q factor. In turn, support 4 rests on a low loss dielectric substrate 6, which may be fabricated of alumina or Duroid.

The r.f. input 30 may be applied by microstrip (as illustrated in the Figures), by stripline, or by a coaxial capacitive probe. Excitation of resonator 2 results in the degenerative $HE_{11\delta}$ mode, which can be resolved into two orthogonal r.f. modes, each of which forms a 45° angle with respect to the characterizing vector of input mode 30. The two orthogonal modes are respectively coupled weakly via conductors 41, 42 to a reversed pair of diodes 35, 36. For example, diode 35 has its anode coupled directly to ground 33 and its cathode coupled via a bonding wire 37 to conductor 41. On the other hand, diode 36 has its cathode coupled to ground 34 via bonding wire 38 and its anode coupled to conductor 42.

The detected d.c. signals from the diodes 35, 36, are coupled via conductors 39, 40, respectively, and combined at output conductor 32, to form the desired frequency discriminator output voltage curve (FIG. 4).

Return loss of frequency discriminator 1 is shown in FIG. 5, in which the center frequency is approximately 8 GHz, and the range of frequencies covered is 0.02 GHz. The power blips represented by the first and second orthogonal modes are 2 MHz apart. Vertical divisions are 5 dB.

One of the advantages of dielectric resonator 2 operating in a $HE_{11\delta}$ mode is the flexibility and wide tuning range. The center frequency at which discriminator 1 operates can be tuned up and down over a range of, e.g., 500 MHz at 4 GHz, without significant degradation of the resonator's Q. This can be accomplished by perturbing the magnetic field, e.g., by turning a tuning screw 24 embedded in the upper plate 14 of housing 8 (see FIG. 3). This changes the center frequency of the frequency discriminator while maintaining the frequency offsets associated with the two orthogonal modes. Turning screw 24 is usually metallic, but may also be dielectric.

The two orthogonal modes can have their frequencies adjusted by means of tuning screws 43, 44 which protrude through the vertical wall 12 of housing 8 and are aligned with the characterizing vectors of the two orthogonal modes. Tuning screws 43, 44 are typically metallic, but may also be dielectric.

In the illustrated embodiment, vertical wall 12 has the shape of a cylindrical sleeve, because resonator 2 has the shape of a right circular cylinder. If resonator 2 had the shape of a rectangular prism, it would be appropriate for wall 12 to be four-sided.

In lieu of or as a supplement to the tuning screw method for frequency offset adjustment, one can change the length of the dielectric 2 in the direction of the characterizing vector for the mode being frequency-offset. Thus, FIG. 2 illustrates an additional piece of dielectric material 50 appended to the primary dielectric 2 in the direction of mode 2, and a notch cut in dielectric resonator 2 in the direction of mode 1.

The frequency discriminator 1 can be temperature compensated by a proper selection of dielectric resonator 2 temperature coefficient. Stabilities better than 0.5 ppm per degree centigrade have been obtained in practice.

The structure of the frequency discriminator 1 illustrated herein is compatible with MIC (microwave integrated circuit) voltage controlled oscillators 5. In the case of MMIC (monolithic microwave integrated circuit) oscillators 5, all components of oscillator 5 and amplifier 3, but not discriminator 1 itself, can be incorporated on a single gallium arsenide chip, forming a very compact structure.

The frequency discriminator 1 described herein above exhibits excellent electrical performance (very narrow bandwidth and good sensitivity), exceptional temperature stability, small size, low weight, and low cost.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A frequency discriminator for stabilizing an electromagnetic oscillator, said discriminator comprising:
    a single dielectric resonator excited by an r.f. input that travels through an input conductor;
    said resonator supported on a low loss, low dielectric constant support which in turn rests on a low loss dielectric substrate;
    said dielectric resonator generating in response to the input excitation two orthogonal modes of electromagnetic r.f. energy at slightly different frequencies; wherein
    the two modes travel through two mode conductors respectively and are converted into two d.c. output signals having opposite polarity and substantially the same magnitude by two oppositely polarized diodes that are respectively positioned in the two mode conductors; and
    the two d.c. output signals are combined to form a control signal which is fed to the oscillator; wherein the input conductor and the the two mode conductors are supported on the dielectric substrate, are physically coupled to the support, and are not physically coupled to the dielectric resonator.

2. The frequency discriminator of claim 1 wherein the input excitation is applied via excitation means from the class comprising microstrip, stripline, and coaxial capacitive probes.

3. The frequency discriminator of claim 1 wherein the two orthogonal modes of electromagnetic energy are degenerative modes each having a characteristic vector that makes an angle of 45° with respect to the characterizing vector of the r.f. input.

4. The frequency discriminator of claim 1 wherein the frequencies of the two orthogonal modes of electromagnetic energy are made to be slightly offset from each other by means of positioning a differing amount of dielectric material along the respective characterizing vectors of the two orthogonal modes.

5. The frequency discriminator of claim 1 wherein the frequencies of the two orthogonal modes of electromagnetic energy are made to be slightly offset from each other by means of a pair of tuning screws positioned along the respective characterizing vectors of the two orthogonal modes, said tuning screws partially protruding through a metallic housing which surrounds the dielectric resonator, the support, and the regions where the input conductor and the two mode conductors are physically coupled to the support.

6. The frequency discriminator of claim 1 wherein the two orthogonal modes of electromagnetic energy are degenerative $HE_{11\delta}$ modes and are made to have slightly offset frequencies, and said frequency discriminator further comprises a tuning screw generally aligned along the major axis of the dielectric resonator; wherein the tuning screw has a small diameter compared with the diameter of the dielectric resonator, and partially protrudes through a metallic housing which surrounds the dielectric resonator, the support, and the regions where the input conductor and the two mode conductors are physically coupled to the support; and said tuning screw is disposed to interact with the magnetic lines of force associated with the dielectric resonator, so that turning the tuning screw changes the center frequency of the frequency discriminator while maintaining the frequency offsets associated with the two orthogonal modes.

7. The frequency discriminator of claim 6 wherein the input excitation is applied via a coaxial capacitive probe excitation means.

8. The frequency discriminator of claim 7 wherein the dielectric resonator has a square cross-section.

* * * * *